(12) United States Patent
Dietrich et al.

(10) Patent No.: US 7,470,866 B2
(45) Date of Patent: Dec. 30, 2008

(54) ELECTRICALLY CONDUCTIVE GASKET

(75) Inventors: John F. Dietrich, Harrisburg, PA (US); Clark S. Hammaker, Middletown, PA (US)

(73) Assignee: Jemic Shielding Technology, Dauphin, PA (US)

( * ) Notice: Subject to any disclaimer, the term of this patent is extended or adjusted under 35 U.S.C. 154(b) by 778 days.

(21) Appl. No.: 10/991,799

(22) Filed: Nov. 18, 2004

(65) Prior Publication Data

US 2006/0103081 A1    May 18, 2006

(51) Int. Cl.
*H05K 9/00* (2006.01)

(52) U.S. Cl. ........................ 174/356; 277/920

(58) Field of Classification Search ............... 174/356, 174/358; 277/920; 361/816, 818
See application file for complete search history.

(56) References Cited

U.S. PATENT DOCUMENTS

| | | | |
|---|---|---|---|
| 3,555,168 A | 1/1971 | Frykberg | |
| 4,414,425 A | 11/1983 | Bogner | |
| 4,857,668 A | 8/1989 | Buonanno | |
| 4,864,076 A | 9/1989 | Stickney | |
| 4,968,854 A | 11/1990 | Benn, Sr. et al. | |
| 5,028,739 A | 7/1991 | Keyser et al. | |
| 5,045,635 A | 9/1991 | Kaplo et al. | |
| 5,068,493 A | 11/1991 | Benn, Sr. et al. | |
| 5,105,056 A | 4/1992 | Hoge, Jr. et al. | |
| 5,107,070 A | 4/1992 | Benn, Sr. et al. | |
| 5,115,104 A | 5/1992 | Bunyan | |
| 5,142,101 A | 8/1992 | Matsuzaki et al. | |
| 5,202,536 A | 4/1993 | Buonanno | |
| 5,250,751 A | 10/1993 | Yamaguchi | |
| 5,578,790 A | 11/1996 | Peregrim | |
| 5,902,956 A | 5/1999 | Spies et al. | |
| 6,204,444 B1 | 3/2001 | Pugliese et al. | |
| 6,248,393 B1 | 6/2001 | Bunyan | |
| 6,525,267 B1 | 2/2003 | Worley et al. | |
| 6,570,755 B2 | 5/2003 | Curlee et al. | |
| 6,613,976 B1 | 9/2003 | Benn, Jr. | |
| 6,621,000 B2 | 9/2003 | Jensen et al. | |
| 6,653,556 B2 | 11/2003 | Kim | |
| 6,818,822 B1 * | 11/2004 | Gilliland et al. ............. | 174/357 |
| 2006/0151962 A1 | 7/2006 | Hammaker et al. | |

* cited by examiner

*Primary Examiner*—Hung V Ngo
(74) *Attorney, Agent, or Firm*—K & L Gates LLP (57) ABSTRACT

An electrically conductive gasket and methods of manufacturing electrically conductive gaskets. In one embodiment, the gasket includes a core that supports an electrically conductive cover thereon. The electrically conductive cover may be attached to the core or portions of the core by one or more adhesives used to also affix the gasket to an electrically conductive object. In other embodiments, a mechanical fastener may be affixed to the core by the one or more adhesives employed to affix the electrically conductive cover to the core.

36 Claims, 9 Drawing Sheets

ELECTRICALLY CONDUCTIVE GASKET

BACKGROUND

1. Field of the Invention

Various embodiments of the subject invention relate to gaskets and, more particularly, to gaskets for inhibiting and preventing leakage of Electromagnetic Interference (EMI) and radio frequency radiation (RFI) between two surfaces or components.

2. Description of the Invention Background

Ever since Benjamin Franklin flew his famous kite in a lightening storm and discovered electricity, countless numbers of electrically powered devices and components have been developed to make man's life easier. Such components range from, for example, motors, switches, relays, timers, computers, etc. Indeed, the list of electrical components seems endless and continues to grow.

With the development and use of such a myriad of electronic components came additional problems that had to be solved to effectively use such components to achieve desired results. An example of one problem is the occurrence of electromagnetic interference (EMI) which is an undesirable electric disturbance that is induced or radiated from electric or electronic devices. Such EMI problems commonly manifest themselves when several electrical components are located in close proximity to one another wherein the EMI radiating from one component hampers or debilitates the effective operation of another component mounted nearby.

To combat problems encountered by EMI, electrical components are often placed or mounted in shielded housings that serve to prevent or inhibit the leakage of EMI therefrom. Such housings are commonly made from a collection of conductive panels that are connected together to form an enclosure. To prevent or inhibit the leakage of EMI between the panels at their points of connection and to prevent the leakage of EMI, for example, between a housing and the housing door, a variety of gaskets have been developed.

Figure 1:
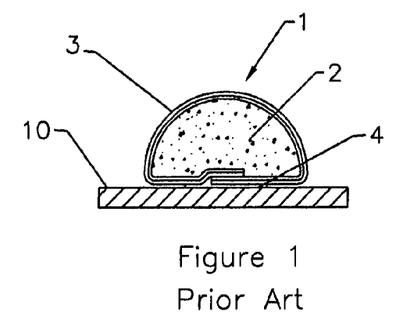
FIG. 1 is a cross-sectional view of a prior gasket design attached to a conductive object such as a housing panel.

One type of gasket that has been developed is illustrated in FIG. 1. As shown in this Figure, gasket 1 includes a resilient or flexible core 2 that is covered by an electrically conductive cover 3. The core 2 generally comprises conventional open cell or closed cell foams, rubbers, plastics or metals and the electrically conductive cover 3 may comprise plated fabric (woven or knitted), plated plastic, plated rubber, electrically conductive foil, electrically conductive woven wire or electrically conductive wire mesh. These gaskets 1 are commonly affixed to the electrically conductive surface 10, which may comprise a cabinet panel, doorframe, etc. (depending upon the particular application) by adhesive 4 or other fastening medium. Such adhesives 4 or fastener means commonly comprise pressure sensitive adhesive, electrically conductive heat activated adhesive or a variety of other types of mechanical fasteners such as clips, screws or rivets.

Figure 2:
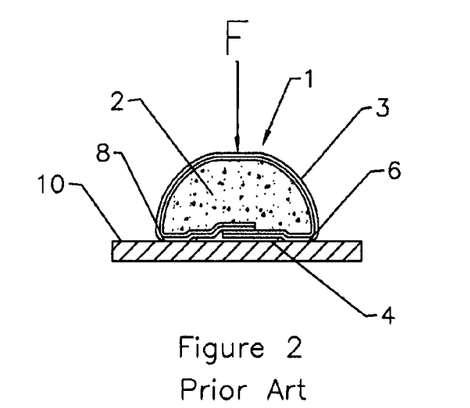
FIG. 2 is a view showing the application of a compression force to the gasket of FIG. 1.

Such attachment approaches, however, can undesirably form a barrier between the electrically conductive cover material 3 and the electrically conductive surface 10. If a conductive path is not established between the cover material 3 and the conductive surface 10 to which the gasket 1 is attached, the gasket's effectiveness is compromised and, in extreme cases, may be destroyed. Furthermore, when employing the prior gaskets of this type, the gaskets rely on the compression of the gasket 1 to force portions 6, 8 of the gasket 1 to flow around the adhesive 4 or mechanical fastener to make sufficient electrical contact with the electrically conductive surface 10. See FIG. 2. Such standard approach of relying on the flowing of portions 6, 8 of the gasket core 2 can result in the failure to establish an electrically conductive path between the electrically conductive surface 10 and the electrically conductive cover 2 when an insufficient amount of compression force F is applied to the gasket 1. One approach to addressing such problem has included the use of conductive pressure sensitive adhesive, which essentially contains conductive particles in the adhesive. Furthermore, if an electrically conductive adhesive is employed to affix the gasket 1 to the electrically conductive surface 10 and to establish an electrically conductive path therebetween, migration of the electrically conductive particles in the adhesive material can occur and compromise the integrity of the electrically conductive path. For example, when placed under continuous pressure, the conductive particles in the adhesive tend to migrate to certain areas and create portions of adhesive that have more conductive particles than other portions of the adhesive. If the portion containing the abundance of conductive particles fails to make effective contact with the gasket cover, no conductive path from the element to which the gasket is attached and the gasket cover may be established.

U.S. Pat. No. 5,578,790 purports to disclose a gasket to address such problems, by employing a pre-shaped inner core with an "extension" protruding from the attachment side. However, this approach may also have undesirable limitations. For example, this gasket requires a specific shape and a particular pressure sensitive attachment method. Moreover, the tolerances that are commonly attainable utilizing known gasket manufacturing processes, make this gasket difficult to manufacture in relatively small sizes. In addition, if the compression forces applied to the gasket when in use are not uniformly applied across the gasket, "rocking" may occur which results in one or more portions of the gasket being moved out of contact with the surface to which it is to be attached. In addition, the shape of the gasket limits the types and shapes of mechanical fasteners that may be employed to attach the gasket to an object. The gaskets disclosed in U.S. Pat. No. 5,105,056 to Hoge and U.S. Pat. No. 6,653,556 to Kim have many similar limitations.

SUMMARY

In accordance with one embodiment of the invention, there is provided a gasket for attachment to an electrically conductive object. One embodiment includes a core that has a perimeter and an attachment portion. An electrically conductive cover that has a first and second end flap is attached to the core by a first adhesive such that the electrically conductive cover extends at least partially around the perimeter of the core and the first and second end flaps are oriented adjacent the attachment portion. A second adhesive is applied to the attachment portion to affix at least one of the first and second end flaps thereto such that a portion of the second adhesive remains exposed on the attachment portion for attaching the gasket to the electrically conductive object such that at least one of the first and second end flaps are retained in contact with the electrically conductive object.

Another embodiment of the present invention comprises a gasket for attachment to an electrically conductive object. This embodiment includes a core that has a perimeter and an attachment portion. An electrically conductive cover that has a first and second end flap is attached to the core by a first adhesive such that the electrically conductive cover extends at least partially around the perimeter of the core and the first and second end flaps are oriented adjacent the attachment portion. A second adhesive is applied to the attachment portion between the end flaps for affixing the gasket to the electrically conductive object such that at least one of the first and second end flaps is retained in contact with the electrically conductive object.

Yet another embodiment of the present invention comprises a gasket for attachment to an electrically conductive object. This embodiment includes a core that has a perimeter and an attachment portion. An electrically conductive cover having a first and second end flap is attached to the core by a first adhesive that is applied only on the attachment portion of the core such that the electrically conductive cover extends at least partially around the perimeter of the core and the first and second end flaps are oriented adjacent the attachment portion. A second adhesive is applied to at least one of the first and second end flaps for affixing the gasket to the electrically conductive object such that at least one of the first and second end flaps is retained in contact with the electrically conductive object and wherein at least a portion of at least one of the first and second end flaps that contacts the electrically conductive object does not have the second adhesive thereon.

Still another embodiment of the present invention comprises a gasket for attachment to an electrically conductive object. This embodiment includes a core that has a perimeter and an attachment portion. This gasket further includes an electrically conductive cover that has first and second end flaps and extends at least partially around the perimeter of the core. A first adhesive is applied to the attachment portion of the core for affixing the first end flap to the attachment portion. A second adhesive is applied to the attachment portion for affixing the second end flap thereto. A portion of the second adhesive is exposed between the first and second end flaps for affixing the gasket to the electrically conductive object such that at least one of the first and second end flaps is retained in contact with the electrically conductive object.

Another embodiment of the present invention is directed to a gasket for attachment to an electrically conductive object. The gasket of this embodiment includes a core that has a perimeter and an attachment portion. An electrically conductive cover extends at least partially around the perimeter of the core. The electrically conductive cover has a first end flap and a second end flap. A first adhesive is applied to the attachment portion of the core for affixing the first and second end flaps thereto such that a portion of the first adhesive remains exposed to affix the gasket to the electrically conductive object and retain at least one of the first and second end flaps in contact with the electrically conductive object.

Yet another embodiment of the present invention comprises a gasket for attachment to an electrically conductive object. The gasket includes a core that has a perimeter and an attachment portion. An electrically conductive cover is wrapped around the perimeter of the core. The electrically conductive cover has a first end flap and a second end flap wherein the second end flap covers at least a portion of the attachment portion of the core. A first adhesive is applied on the portion of the second end flap covering the attachment portion for attaching a portion of the first end flap thereto to retain the electrically conductive cover on the core. A portion of the first adhesive is exposed for affixing the gasket to the electrically conductive object and retains at least one of the first and second end flaps in contact with the electrically conductive object.

Yet another embodiment of the present invention comprises a gasket for attachment to an electrically conductive object. The gasket includes a core that has a perimeter and an attachment portion. An electrically conductive cover that has a first and second end flap is attached to the core by a first adhesive such that the electrically conductive cover extends at least partially around the perimeter of the core and the first end flap is attached to the attachment portion. A mechanical fastener for coupling the gasket to the electrically conductive object is employed. The mechanical fastener has a fastener portion that is adjacent to the attachment portion of the core and is affixed thereto by the second end tab and first adhesive such that when the mechanical fastener is attached to the electrically conductive object, the second end flap is retained in contact with the electrically conductive object.

Those of ordinary skill in the art will readily appreciate, however, that these and other details, features and advantages will become further apparent as the following detailed description of the preferred embodiments proceeds.

BRIEF DESCRIPTION OF THE DRAWINGS

In the accompanying Figures, there are shown present preferred embodiments of the invention wherein like reference numerals are employed to designate like parts and wherein.

DETAILED DESCRIPTION

Referring now to the drawings for the purposes of illustrating embodiments of the invention only and not for the purposes of limiting the same, FIGS. 3-6 illustrate a gasket assembly 110 comprising one embodiment of the present invention which may be attached to an electrically conductive object 101 such as a portion of a housing used to house electrical components. As the present Detailed Description proceeds, the reader will appreciate that the various embodiments of the present invention may be effectively employed for example, to seal the interface between an enclosure and a door or panel, but various embodiments may also find use in other applications such as providing electrical continuity between two adjoining panels, such as walls in a shielded room, or providing a conductive environmental seal between two adjoining equipment sections. Thus, as used herein, the term "electrically conductive object" can refer to any object that may conduct electricity.

Figure 3:
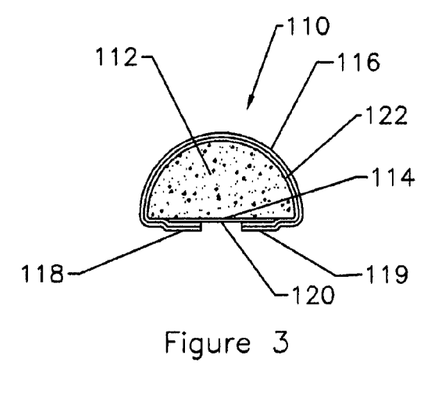
FIG. 3 is a cross-sectional view of one gasket assembly embodiment of the present invention.
Figure 4:
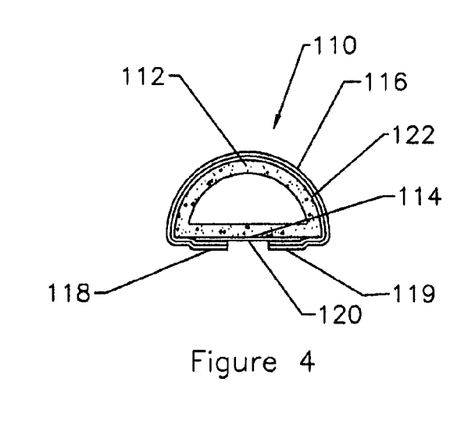
FIG. 4 is a cross-sectional view of another gasket assembly embodiment of the present invention.

In this embodiment, gasket assembly 110 includes a core 112 which may be solid (FIG. 3) or hollow (FIG. 4). In several alternative embodiments, the core 112 is made from a flexible or relative compressible material such as, for example, various closed and open cell foams such as those closed and open cell foams supplied by, for example, Alloy Extrusion of 4211 Karg Industrial Pkwy, Brimfield, Ohio 44240, or rubber, such as that rubber material supplied by Alloy Extrusion of 4211 Karg Industrial Pkwy, Brimfield, Ohio 44240, or plastic, such as that plastic material supplied Alloy Extrusion of 4211 Karg Industrial Pkwy, Brimfield, Ohio 44240 or metal, such as that metal core material supplied by Omega Shielding Products of Randolph, N.J. In other embodiments, however, relatively incompressible material or a composite of compressible and incompressible materials (metal, rigid plastic, rubber, etc.) may be employed to form the core 112.

Core 112 may be advantageously shaped utilizing conventional manufacturing techniques to fit a particular sealing application. For example, the shape of core 112, when viewed in cross-section, may be D-shaped, square-shaped, rectangular-shaped, P-shaped, L-shaped, U-shaped, O-shaped, etc. A variety of different methods are known in the art to form the core in a desired shape. Accordingly, such conventional shaping and core manufacturing methods will not be discussed in great detail herein.

The portion of the core 112 that is adjacent to or constructed for attachment to a conductive object 101 will be referred to herein as the attachment face or attachment portion 114. See FIG. 3. In this embodiment, the attachment portion 114 is attached to the conductive object 101 (cabinet panel, etc.) by adhesive 120 (means for attaching the gasket assembly to a conductive surface). In one embodiment, adhesive 120 comprises a conventional pressure sensitive adhesive, such as that pressure sensitive adhesive manufactured by 3M of St. Paul, Minn. Such pressure sensitive adhesive 120 may be "double-sided" and is applied to the attachment portion 114 of the core 112 by applying pressure to the adhesive and/or the core 112. In an alternative embodiment, adhesive 120 may comprise a conventional hot melt adhesive, such as that hot melt adhesive manufactured by 3M of St. Paul, Minn. Other forms and sources of adhesives, pressure sensitive adhesives or hot melt adhesives may be successfully employed. In various gasket assembly embodiments of the present invention, it is not necessary for the adhesive 120 to have the ability to conduct electrical current. That is, the effectiveness of various embodiments of the present invention do not necessarily rely on the adhesive 120 itself to form an electrically conductive path between the conductive object 110 and the gasket 110. However, electrically conductive pressure sensitive adhesive arrangement or electrically conductive hot melt adhesive arrangements could be employed, if desired.

Also in this embodiment, a portion of the outer perimeter of core 112 is covered with an electrically conductive cover member 116. As used herein, the term "electrically conductive" means the ability to facilitate the passage of an electrical current therethrough. In this embodiment, electrically conductive cover member 116 may comprise conventional "plated" fabric (woven, non-woven or knitted) such as that plated fabric supplied by Swift Textile of Bloomfield, Conn. The electrically conductive cover member 116 may also be fabricated from plated plastic such as that electrically conductive plated plastic material supplied by Rogers Corporation of 245 Woodstock Road, Woodstock, Conn. 06281, electrically conductive coated rubber such as that electrically conductive coated rubber material supplied by Rogers Corporation of 245 Woodstock Road, Woodstock, Conn. 06281, electrically conductive foil such as that conductive foil supplied by Rogers Corporation of 245 Woodstock Road, Woodstock, Conn. 06281, electrically conductive woven wire such as that electrically conductive woven wire manufactured by, for example, Screen Technology Group Inc. of Washougal Wash. or electrically conductive wire mesh, such as that conductive wire mesh manufactured by, for example, Screen Technology Group Inc. of Washougal Wash. The foregoing materials are generally supplied in "sheet" form such that they may be cut to a desired length and width and applied to the core 112 in a variety of different manners as will be discussed in further detail below. It is conceivable, however, that the electrically conductive cover 116 may be formed on the perimeter of the core 112 by spraying or otherwise applying a liquid coating that is electrically conductive. With respect to those embodiments specifically employing sheet-like covers, as used herein, the term "sheet-like" refers to materials that are formed in a sheet and which may be cut to length and applied to the core as a continuous sheet and does not refer to those coatings that are sprayed, dipped or otherwise applied in liquid form.

In the embodiment depicted in FIGS. 3 and 4, the electrically conductive cover material 116 is provided with a desired width such that when wrapped around the core 112, the end flaps 118 and 119 are positioned around the perimeter of the core 112 as shown. In one embodiment, the electrically conductive cover material 116 is affixed to the core 112 by a commercially available adhesive 122. For example, the adhesive 122 may comprise a hot melt type adhesive such as that hot melt adhesive manufactured by 3M of St. Paul, Minn. However, other types and compositions of adhesives may be employed. In one embodiment, for example, the adhesive 122 is not electrically conductive. However, electrically conductive adhesives may also be employed to affix the cover material 116 to the core 112, if desired. As can be seen in FIGS. 3 and 4, the adhesive 122 may overlap portions of adhesive 120 which serves to affix the flaps 118 and 119 of the electrically conductive cover 116 to the attachment portion 114 of the core 112.

Figure 5:
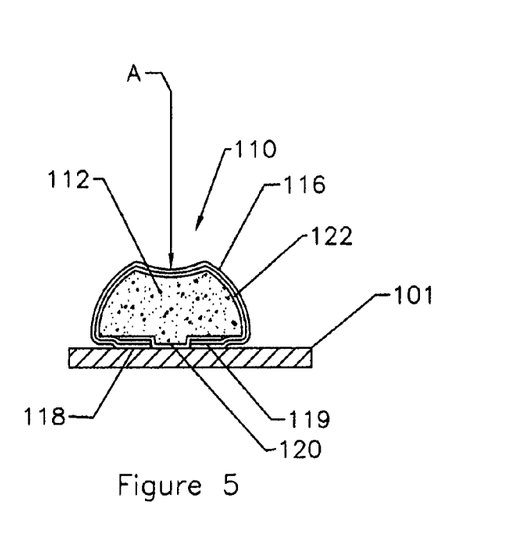
FIG. 5 is a cross-sectional view of the gasket assembly embodiment of FIG. 3 illustrating the attachment of the gasket assembly to a conductive object.
Figure 6:
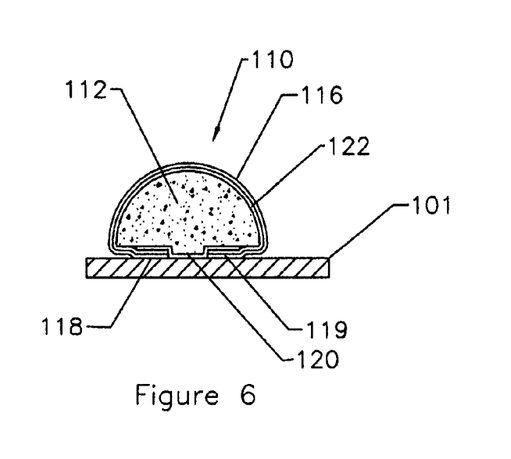
FIG. 6 is a cross-sectional view of the gasket assembly embodiment depicted in FIGS. 3 and 5 attached to a conductive object.

As can be seen in FIGS. 5 and 6, the gasket assembly 110 may be attached to a conductive object 101 by applying a force (represented by arrow "A" in FIG. 5) to the gasket assembly 110 to force the adhesive 120 into contact with the conductive object 101. In the alternative, a force or forces may be applied to the conductive object 101 or to both the gasket 110 and the conductive object 101 to cause the adhesive 120 to adhere to the conductive object 101 as shown in FIG. 6. As can be seen in FIG. 6, the adhesive 120 affixes the gasket assembly 110 to the conductive object 101 and the conductive flaps 118, 119 are retained in contact with the conductive object 101 to permit the flow of electrical current between the conductive object 101 and the electrically conductive cover 116. Thus, there is no need to rely electrical conductivity properties of the adhesive 120 (or adhesive 122) to establish a conductive path between the conductive object 101 and electrically conductive cover member 116. Furthermore, because the adhesive 120 (or adhesive 122) does not have to be electrically conductive, the inconsistencies resulting from the migration of the conductive particles in the adhesive are avoided.

Figure 7:
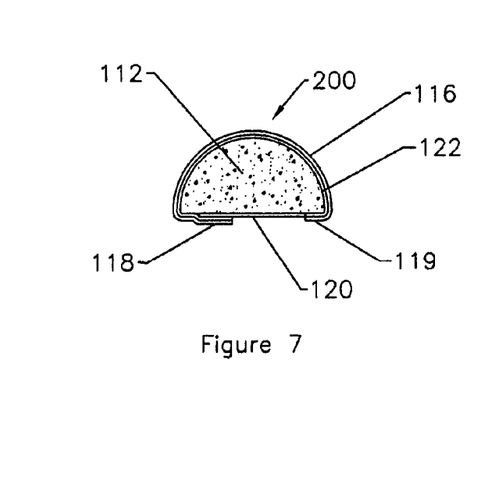
FIG. 7 is a cross-section view of another gasket assembly embodiment of the present invention.
Figure 8:
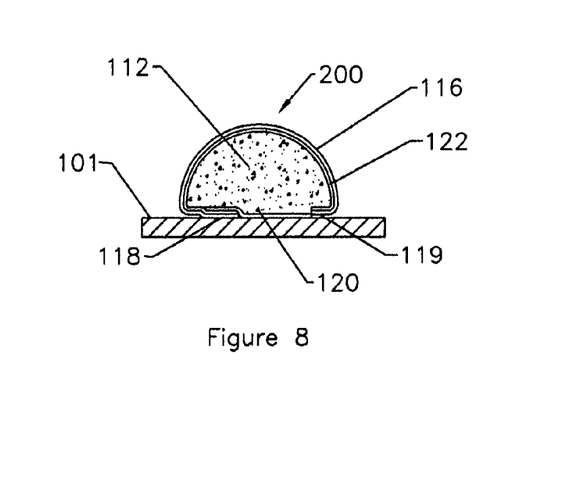
FIG. 8 is a cross-sectional view of the gasket assembly embodiment of FIG. 6 attached to a conductive object.

FIGS. 7 and 8 illustrate another embodiment of the gasket assembly 200 of the present invention. This embodiment may be fabricated in a manner that is substantially identical to the manner in which gasket assembly 110 is fabricated, except that in this embodiment, only flap 118 overlaps the adhesive 120. Flap 119 essentially abuts the adhesive 120, but does not overlap it. To affix the gasket assembly 200 to a conductive object 101, a force is applied to the gasket assembly 200 and/or the conductive object 101 to bring the adhesive 120 into contact with the conductive object 101. See FIG. 8. The adhesive 120 retains the flaps 118 and 119 in contact with the conductive object 101 to permit the flow of electrical current between the conductive object 101 and the electrically conductive cover 116. As with the gasket assembly 110 described above, the adhesive 120 may be a pressure sensitive adhesive or a hot melt adhesive. Other forms of adhesives may also be used. Because this embodiment does not rely on the adhesive 120 itself to function as the conductive path between the gasket assembly and the conductive object 101, the adhesive 120 does not have be electrically conductive. However, if desired, adhesive 120 could be electrically conductive.

Figure 9:
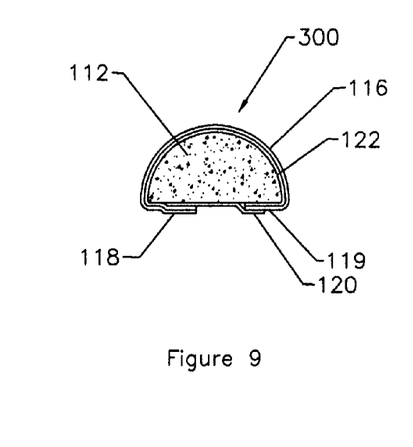
FIG. 9 is a cross-sectional view of another gasket assembly embodiment of the present invention.
Figure 10:
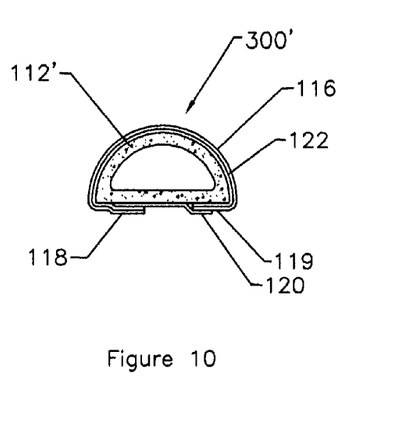
FIG. 10 is a cross-sectional view of another gasket assembly embodiment of the present invention.
Figure 11:
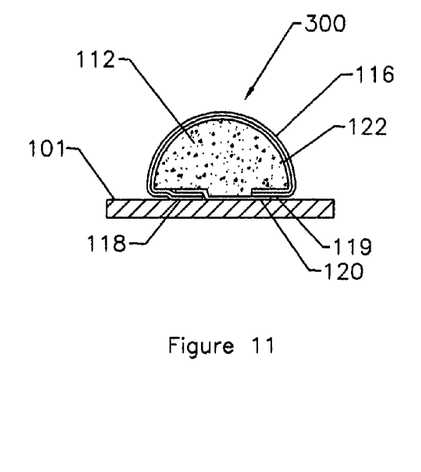
FIG. 11 is a cross-sectional view of the gasket assembly embodiment of FIG. 10 attached to a conductive object.

FIGS. 9 and 11 depict yet another embodiment of the present invention which comprises a gasket assembly 300 that may be fabricated from the same components and methods that were described above with respect to gasket assembly 110, except that in this embodiment, the adhesive 120 overlaps the flap 119 of the electrically conductive cover 116. To affix the gasket assembly 300 to a conductive object 101, a force or forces are applied to the gasket assembly 300 and/or the conductive object 101 to bring the adhesive 120 into contact with the conductive member 101. See FIG. 11. The adhesive 120 retains the flap 118 in contact with the conductive object 101 to permit the flow of electrical current therebetween. As with the gasket assembly 110 described above, the adhesive 120 (and adhesive 122) may be a pressure sensitive adhesive or a hot melt adhesive. Because this embodiment does not rely on the adhesive 120 itself to function as the conductive path between the gasket assembly and the conductive object 101, the adhesive 120 (and adhesive 122) do not have be electrically conductive. However, if desired, adhesive 120 (and/or adhesive 122) could be electrically conductive. The gasket assembly 300' depicted in FIG. 10 is identical to the gasket assembly 300 of FIGS. 9 and 11, except that the core 112' is hollow.

Figure 12:
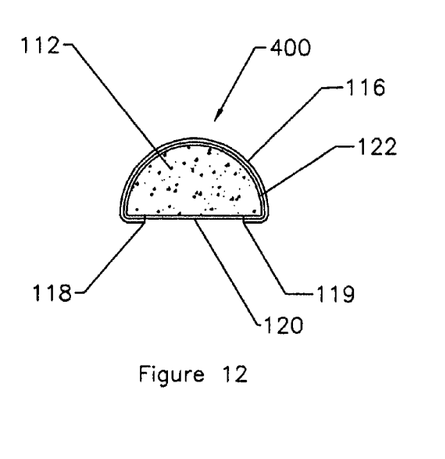
FIG. 12 is a cross-sectional view of another gasket assembly embodiment of the present invention.
Figure 13:
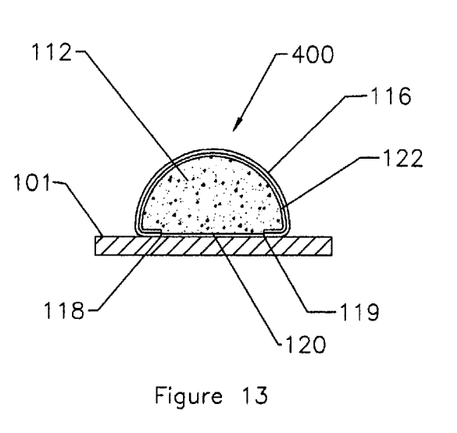
FIG. 13 is a cross-sectional view of the gasket assembly of FIG. 12 attached to a conductive object.

Another gasket assembly 400 of the present invention is depicted in FIGS. 12 and 13. In this embodiment, gasket assembly 400 may be fabricated from the same components and methods that were described above with respect to gasket assembly 110, except that in this embodiment, the flaps 118 and 119 of the conductive cover 116 do not overlap the adhesive 120 and the conductive cover 116 is specifically fabricated from sheet-like materials of the types and construction described above. To affix the gasket assembly 400 to a conductive object 101, a force or forces are applied to the gasket assembly 400 and/or the conductive object 101 to bring the adhesive 120 into contact with the conductive member 101. See FIG. 13. The adhesive 120 retains the flaps 118 and 119 in contact with the conductive object 101 to permit the flow of electrical current therebetween. As with the gasket assembly 110 described above, the adhesive 120 (and/or the adhesive 122) may be a pressure sensitive adhesive or a hot melt adhesive. Because this embodiment does not rely on the adhesive 120 (or adhesive 122) to function as the conductive path between the gasket assembly and the conductive object 101, the adhesive 120 (and/or adhesive 122) does not have be electrically conductive. However, if desired, adhesive 120 (and/or adhesive 122) could be electrically conductive.

Figure 14:
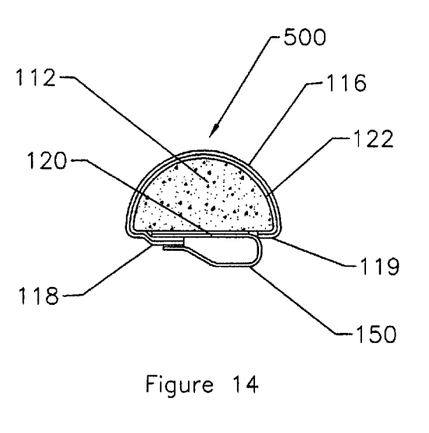
FIG. 14 is a cross-sectional view of another gasket assembly embodiment of the present invention.
Figure 15:
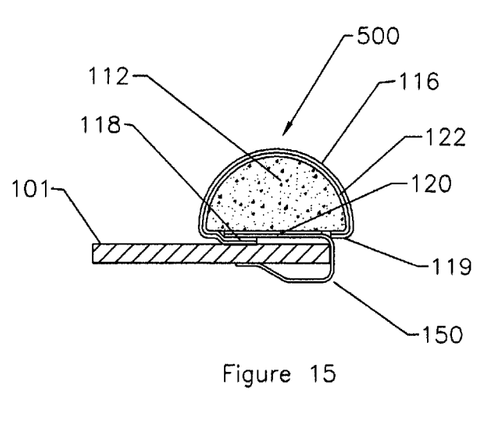
FIG. 15 is a cross-sectional view of the gasket assembly embodiment of FIG. 14 attached to a conductive object.

FIGS. 14 and 15 illustrate yet another gasket assembly 500 of the present invention. In this embodiment, gasket assembly 500 may be fabricated from the same components and methods that were described above with respect to gasket assembly 110. However, in this embodiment, a mechanical clip 150 is attached to the attachment portion 114 of the core 112 by adhesive or other similar attachment method. The clip 150 may be fabricated from an electrically conductive material such as metal. However, clip 150 may also be fabricated from a material that is not electrically conductive (i.e., plastic, etc.) The gasket assembly 500 may be attached to an electrically conductive object 101, by inserting the clip over an edge of the object 101. See FIG. 15. As can be seen in that Figure, clip 150 retains flap 118 of the conductive cover 116 in contact with the electrically conductive object 101 to permit the flow of electrical current therebetween.

Figure 16:
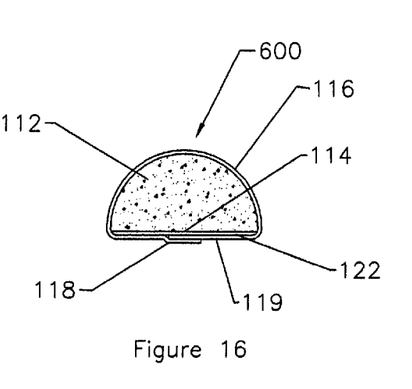
FIG. 16 is a cross-sectional view of another gasket assembly embodiment of the present invention.
Figure 17:
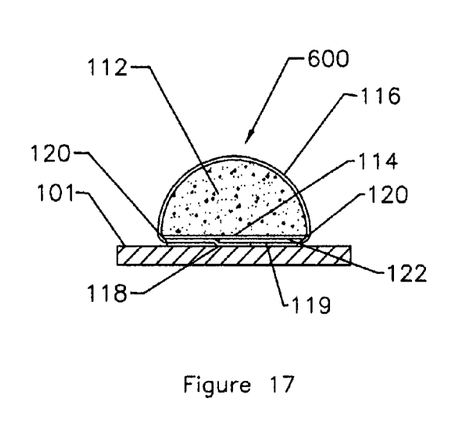
FIG. 17 is a cross-sectional view of the gasket assembly embodiment of FIG. 16 attached to a conductive object.

FIGS. 16 and 17 illustrate another gasket assembly 600 of the present invention. As can be seen in these Figures, the gasket assembly 600 includes a core 112 of any of the types and constructions described above. An electrically conductive cover 116 of any of the types and constructions described above is also employed. However, in this embodiment, the adhesive employed to affix the electrically conductive cover 116 to the core 112 is not applied to the entire outer surface of the core 112. In the embodiment depicted in FIGS. 16 and 17, the adhesive 122 is applied to the attachment portion 114 of the core 112 and the end flaps 118 and 119 are arranged as shown to overlap the adhesive 122 and retain the cover 116 on the core 112. In the embodiment depicted in FIG. 17, the gasket assembly 600 may be affixed to an electrically conductive object 101, by adhesive 120 applied to portions of the flaps 118 and 119. The adhesive retains the flap 118 in contact with the electrically conductive object 101 to permit the flow of electrical current therebetween.

As with the gasket assembly 110 described above, the adhesives 120, 122 may be pressure sensitive adhesive or a hot melt adhesive. Because this embodiment does not rely on the adhesives 120, 122 to function as the conductive path between the gasket assembly 600 and the electrically conductive object 101, the adhesive 120, 122 do not have be electrically conductive. However, if desired, adhesives 120,122 could be electrically conductive.

Figure 18:
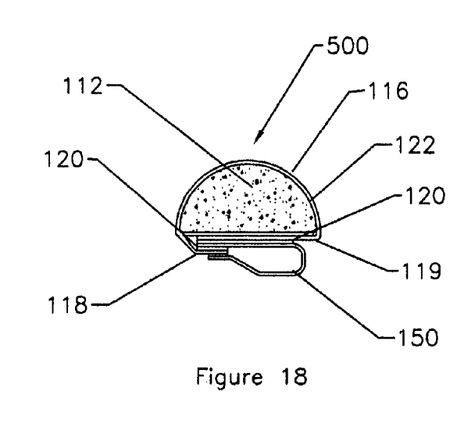
FIG. 18 is a cross-sectional view of another gasket assembly embodiment of the present invention.

FIG. 18 illustrates the attachment of a mechanical fastener such as a clip 150 to the gasket assembly 600. The clip may be affixed to the flap 119 by adhesive (pressure sensitive or hot melt adhesive of the types described above, etc). The clip 150 serves to retain flap 118 in contact with the electrically conductive object 101 to permit the flow of electrical current therebetween. Thus, it is not necessary for the adhesives 120, 122 used to affix the clip 150 to the flap 119 to have electrically conductive properties. However, adhesive having such electrically conductive properties could be employed.

Figure 19:
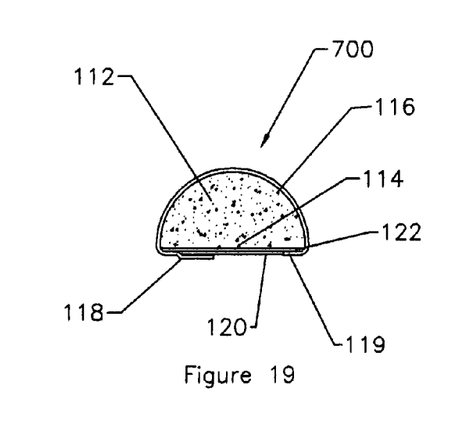
FIG. 19 is a cross-sectional view of another gasket assembly embodiment of the present invention.
Figure 20:
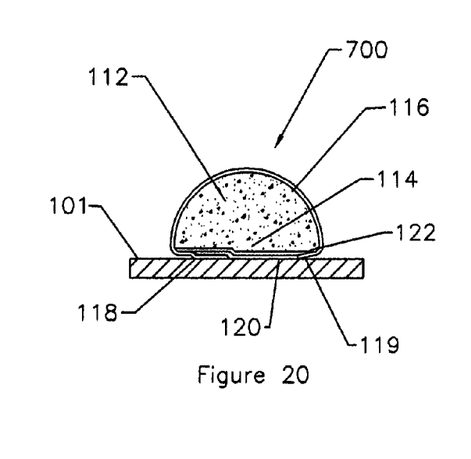
FIG. 20 is a cross-sectional view of the gasket assembly embodiment of FIG. 19 attached to a conductive object.
Figure 21:
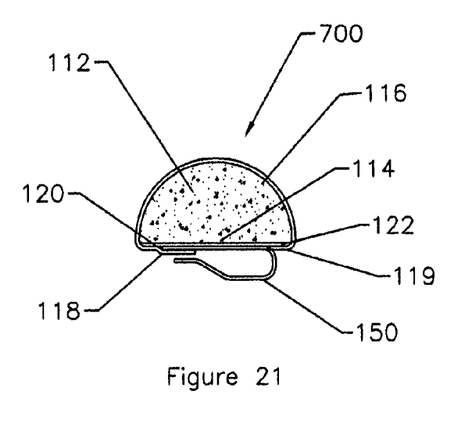
FIG. 21 is a cross-sectional view of another gasket assembly embodiment of the present invention.

FIGS. 19 and 20 illustrate another gasket assembly 700 of the present invention. As can be seen in these Figures, the gasket assembly 700 includes a core 112 of any of the types and constructions described above. An electrically conductive cover 116 of any of the types and constructions described above is also employed. However, in this embodiment, the adhesive 122 employed to affix the electrically conductive cover to the core 112 is not applied to the entire outer surface of the core 112. In the embodiment depicted in FIGS. 19 and 20, the adhesive 122 is applied to the attachment portion 114 of the core 112. Additional attachment means such as an adhesive 120 of the types describe above may be applied to adhesive 122 and the end flap 118 may overlap the adhesive 120. The gasket assembly 700 may be affixed to an electrically conductive object 101, by applying a force or forces to the gasket assembly 700 and/or the electrically conductive object 101 to bring adhesive 120 into contact with the conductive member 101. See FIG. 20. The adhesive 120 retains the flap 118 of the conductive cover 116 in contact with the electrically conductive object 101 to permit the flow of electrical current therebetween. FIG. 21 illustrates the use of a mechanical fastener such as a clip 150 to affix the gasket assembly 700 to the electrically conductive object 101. As can be seen in that Figure, clip 150 is affixed to the attachment portion 114 of the core 112 by adhesive 122. Clip 150 retains flap 118 of the electrically conductive cover 116 in contact with the electrically conductive object 101 to permit the flow of electrical current therebetween.

Figure 22:
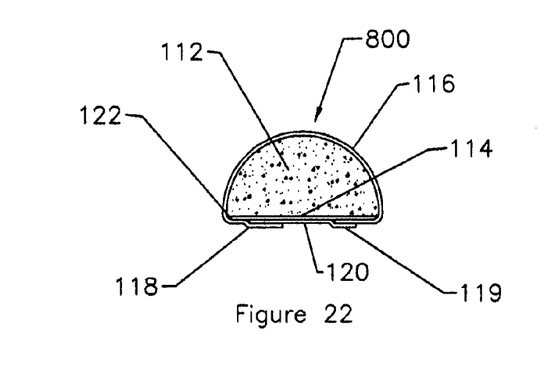
FIG. 22 is a cross-sectional view of another gasket assembly embodiment of the present invention.
Figure 23:
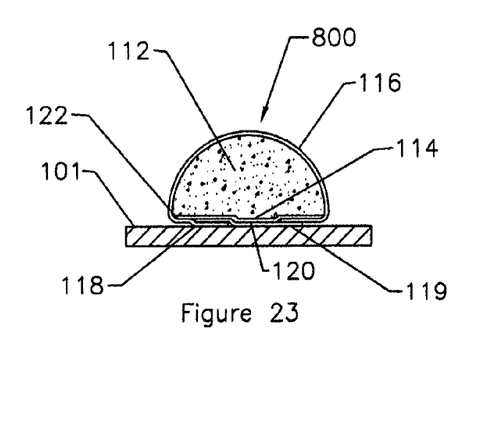
FIG. 23 is a cross-sectional view of the gasket assembly embodiment of FIG. 22 attached to a conductive object.

FIGS. 22 and 23 illustrate another gasket assembly 800 of the present invention. As can be seen in these Figures, the gasket assembly 800 includes a core 112 of any of the types and constructions described above. An electrically conductive cover 116 of any of the types and constructions described above is also employed. However, in this embodiment, the adhesive 122 employed to affix the electrically conductive cover 116 to the core 112 is not applied to the entire outer surface of the core 112. In the embodiment depicted in FIGS. 22 and 23, the adhesive 122 is applied to the attachment portion 114 of the core 112 and the end flaps 118 and 119 are arranged as shown to overlap the adhesive 122 and retain the cover 116 on the core 112. In this embodiment, the gasket assembly 800 may be affixed to an electrically conductive object 101, by adhesive 120 applied to portions of the flaps 118 and 119. The adhesive 120 retains the flap 118 in contact with the electrically conductive object 101 to permit the flow of electrical current therebetween. As with the gasket assembly 110 described above, the adhesives 120, 122 may be a pressure sensitive adhesive or a hot melt adhesive. Because this embodiment does not rely on the adhesives 120, 122 to form a conductive path between the gasket assembly and the electrically conductive object 101, the adhesive 120 does not have be electrically conductive. However, if desired, adhesive 120 could be electrically conductive.

Figure 24:
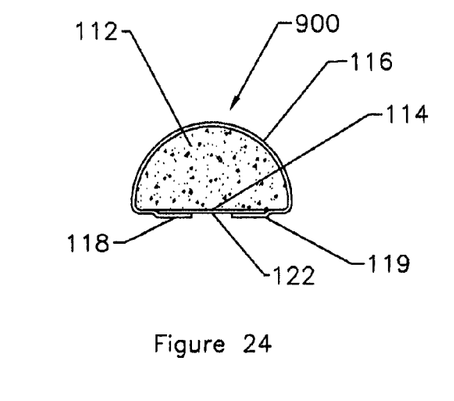
FIG. 24 is a cross-sectional view of another gasket assembly embodiment of the present invention.
Figure 25:
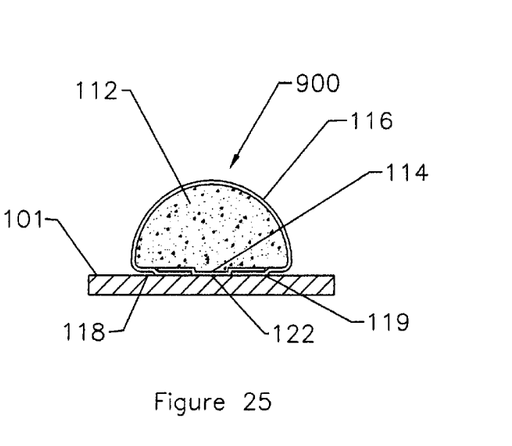
FIG. 25 is a cross-sectional view of the gasket assembly of FIG. 24 attached to a conductive object.

FIGS. 24 and 25 illustrate another gasket assembly 900 of the present invention. As can be seen in these Figures, the gasket assembly 900 includes a core 112 of any of the types and constructions described above. An electrically conductive cover 116 of any of the types and constructions described above is also employed. However, in this embodiment, the adhesive 122 employed to affix the electrically conductive cover 116 to the core 112 is not applied to the entire outer perimeter of the core 112. In the embodiment depicted in FIGS. 24 and 25, the adhesive 122 is applied to the attachment portion 114 of the core 112 and the end flaps 118 and 119 are arranged as shown to overlap the adhesive 122 and retain the cover 116 on the core 112. The gasket assembly 900 may also be affixed to an electrically conductive object 101, by the adhesive 122, which retains the flaps 118 and 119 in contact with the electrically conductive object 101. See FIG. 25. As with the gasket assembly 110 described above, the adhesive 122 may be pressure sensitive adhesive, hot melt adhesive, etc. Because this embodiment does not rely on the adhesive 122 to establish a conductive path between the gasket assembly 900 and the electrically conductive object 101, the adhesive 122 does not have be electrically conductive. However, if desired, adhesive 122 could be electrically conductive.

Figure 26:
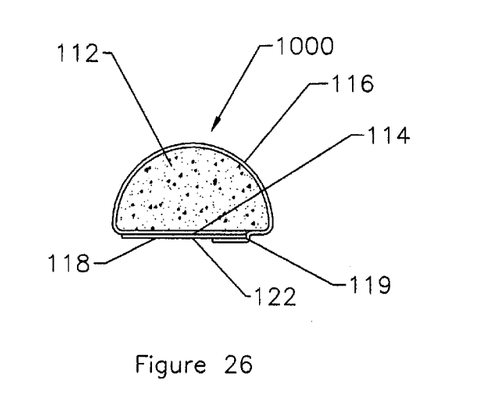
FIG. 26 is a cross-sectional view of another gasket assembly embodiment of the present invention.
Figure 27:
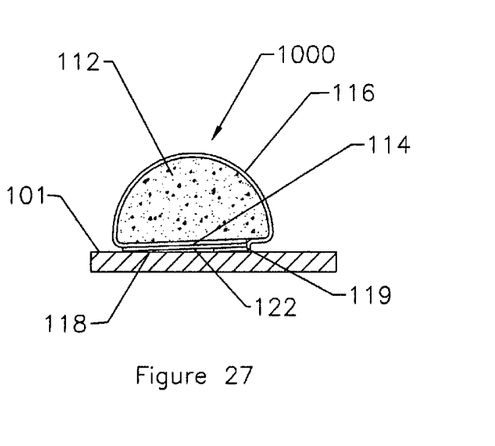
FIG. 27 is a cross-sectional view of the gasket assembly embodiment of FIG. 26 attached to a conductive object.

FIGS. 26 and 27 illustrate another gasket assembly 1000 of the present invention. As can be seen in these Figures, the gasket assembly 1000 includes a core 112 of any of the types and constructions described above. An electrically conductive cover 116 of any of the types and constructions described above is also employed. However, in this embodiment, the adhesive 122 employed to affix the electrically conductive cover to the core 112 is not applied to the core 112. In this embodiment, the adhesive 122 is applied to the flap 118, which extends across the attachment portion 114 of the core 112. Flap 119 overlaps the flap 118 and is affixed thereto by adhesive 122. The gasket assembly 1000 may also be affixed to an electrically conductive object 101 by the adhesive 122 as shown. Adhesive 122 retains flap 119 of the electrically conductive cover 116 in direct contact with the electrically conductive object 101 to permit the flow of electrical current therebetween. The adhesive 122 may be a pressure sensitive adhesive or a hot melt adhesive. Because this embodiment does not rely on the adhesive 122 itself to form a conductive path between the gasket assembly 1000 and the electrically conductive object 101, the adhesive 122 does not have be electrically conductive. However, if desired, adhesive 122 could be electrically conductive.

Figure 28:
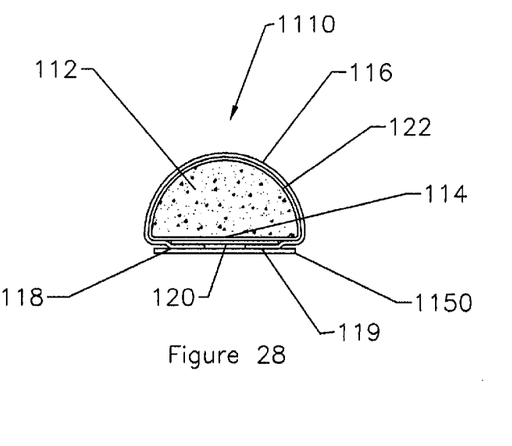
FIG. 28 is a cross-sectional view of another gasket assembly embodiment of the present invention.

FIG. 28 illustrates yet another gasket assembly 1100 of the present invention. In this embodiment, the gasket assembly includes a core 112 of any of the types and constructions described above. An electrically conductive cover 116 of any of the types and constructions described above is also employed. The cover 116 is attached to the core 112 by adhesive 122 applied to the outer surface of the core 112. In addition, adhesive 120 is applied to the portion of the adhesive 122 that is applied to the attachment portion 114 of the core 112. The flaps 118 and 119 of the electrically conductive cover 116 are affixed to the core by the adhesive 120 which would also be used to affix the gasket assembly 1100 to an electrically conductive object. In this embodiment, a release liner 1150 is releasably affixed to the adhesive 120. One type of release liner 1150 that may be used is that release liner supplied by 3M of St. Paul, Minn. However other release liners may be successfully employed to protect the adhesive 120 prior to use. When it is desired to affix the gasket assembly 1100 to an electrically conductive object, the release liner 1150 is removed and a force or forces are applied to the gasket assembly 1100 and/or the electrically conductive object to cause the adhesive to adhere to the electrically conductive object 101 and thereby retain flaps 118, 119 of the electrically conductive cover 116 in contact with the electrically conductive object to permit electrical current to pass therebetween.

Figure 29:
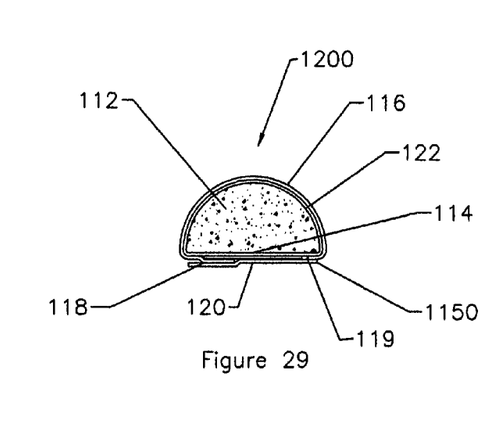
FIG. 29 is a cross-sectional view of another gasket assembly embodiment of the present invention.

Another gasket assembly 1200 of the present invention is depicted in FIG. 29. In this embodiment, the gasket assembly 1200 includes a core 112 of any of the types and constructions described above. An electrically conductive cover 116 of any of the types and constructions described above is also employed. The cover 116 is attached to the core 112 by adhesive 122 applied to the outer surface of the core 112. In addition, adhesive 120 is applied to the portion of the adhesive 122 that is applied to the attachment portion 114 of the core 112. The flap 119 of the electrically conductive cover 116 is folded over onto the adhesive 122 on the attachment face 114 of the core 112 and the flap 118 is folded over onto the adhesive 120 which is also used to affix the gasket assembly 1200 to a conductive object 101. In this embodiment, a release liner 1150 of the types and construction described above is attached to the adhesive 120. When it is desired to affix the gasket assembly 1200 to an electrically conductive object 101, the release liner 1150 is removed and force is applied to the gasket assembly 1200 and/or the conductive object to cause the adhesive 120 to adhere to the electrically conductive object 101.

Figure 30:
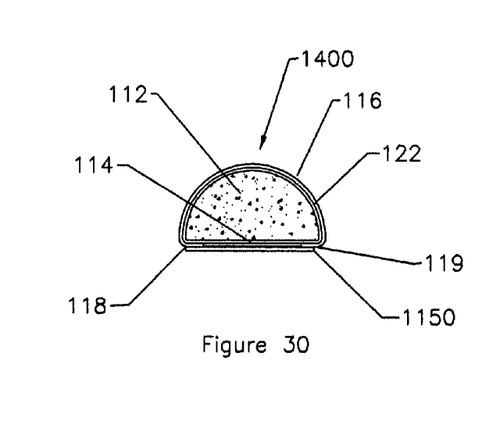
FIG. 30 is a cross-sectional view of another gasket assembly embodiment of the present invention.

Another gasket assembly 1400 of the present invention is depicted in FIG. 30. In this embodiment, the gasket assembly 1400 includes a core 112 of any of the types and constructions described above. An electrically conductive cover 116 of any of the types and constructions described above is also employed. The cover 116 is attached to the core 112 by adhesive 122 applied to the outer surface of the core 112. Flaps 118 and 119 of the electrically conductive cover 116 are folded over onto the adhesive 122 that is applied to the attachment portion 114 of the core 112. Adhesive 122 also serves to affix the gasket assembly 1400 to an electrically conductive object 101. In this embodiment, a release liner 1150 of the types and construction described above is attached to the adhesive 122. When it is desired to affix the gasket assembly 1400 to an electrically conductive object, the release liner 1150 is removed and a force or forces are applied to the gasket assembly 1400 and/or the conductive object to cause the adhesive 122 on the attachment portion 114 of the core 112 to adhere to the electrically conductive object 101.

Figure 31:
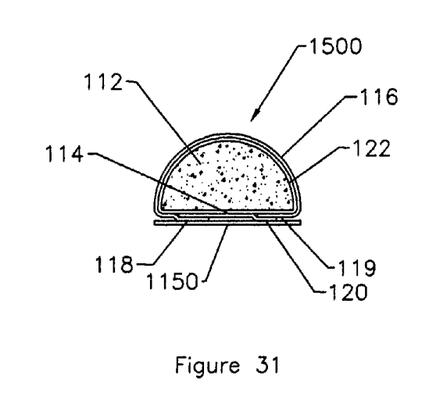
FIG. 31 is a cross-sectional view of another gasket assembly embodiment of the present invention.

FIG. 31 depicts another gasket assembly 1500 of the present invention. In this embodiment, the gasket assembly 1500 includes a core 112 of any of the types and constructions described above. An electrically conductive cover 116 of any of the types and constructions described above is also employed. The cover 116 is attached to the core 112 by adhesive 122 applied to the outer surface of the core 112. The flap 119 of the electrically conductive cover 116 is folded over onto the adhesive 122 that is applied to the attachment portion 114 of the core 112. In addition, adhesive 120 is applied to the portion of the adhesive 122 that is applied to the attachment portion 114 of the core 112. The flap 118 of the electrically conductive cover 116 is folded over onto the adhesive 120 which over laps the flap 119 and used to affix the gasket assembly 1500 to an electrically conductive object 101. In this embodiment, a release liner 1150 of the types and construction described above is attached to the adhesive 122. When it is desired to affix the gasket assembly 1500 to an electrically conductive object, the release liner 1150 is removed and a force or forces are applied to the gasket assembly 1500 and/or the electrically conductive object 101 to cause the adhesive 120 to adhere to the electrically conductive object 101.

Figure 32:
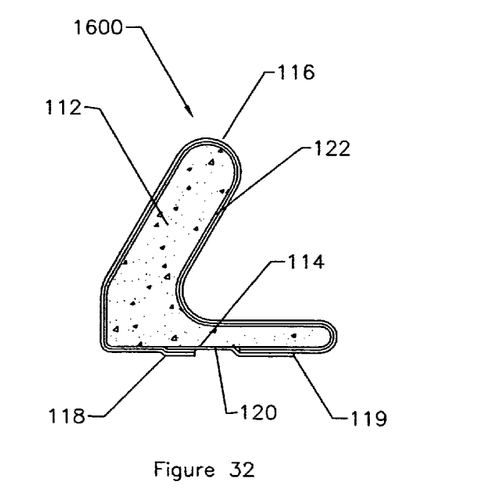
FIG. 32 is a cross-sectional view of another gasket assembly embodiment of the present invention.

FIG. 32 illustrates an L-shaped or C-shaped gasket assembly 1600 of the present invention. This embodiment includes an L-shaped or C-shaped core 112 of any of the types and constructions described above. An electrically conductive cover 116 of any of the types and constructions described above is also employed. The cover 116 is attached to the core 112 by adhesive 122 applied to the cover 116. Flap 119 of the electrically conductive cover 116 is attached directly to the cover 116. In addition, adhesive 120 is applied to a portion of the attachment portion 114 of the core 112 and the flap 118 is folded over onto the adhesive 120, which is also used to affix the gasket assembly 1600 to an electrically conductive object 101. Adhesive 120 may also overlap the flap 119 to affix that flap to the electrically conductive object 101.

Figure 33:
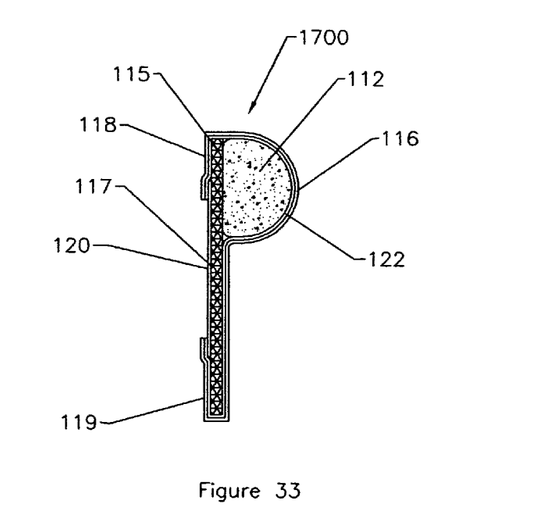
FIG. 33 is a cross-sectional view of another gasket assembly embodiment of the present invention.

FIG. 33 illustrates a P-shaped gasket assembly 1700 of the present invention. This embodiment includes a core 112 of any of the types and constructions described above that is mounted to a rigid element 115 such as, for example, a plastic strip. An electrically conductive cover 116 of any of the types and constructions described above is also employed. The cover 116 is attached to the core 112 and element 115 by adhesive 122 by folding flaps 118,119 of the electrically conductive cover 116 onto the adhesive 120. The portion of adhesive 120 that is exposed between flaps 118, 119 is employed to affix the gasket assembly 1700 to a conductive object.

Figure 34:
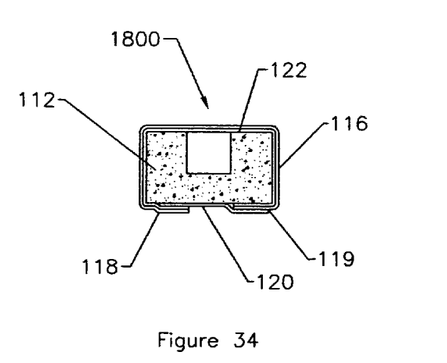
FIG. 34 is a cross-sectional view of another gasket assembly embodiment of the present invention.

FIG. 34 illustrates a U-shaped shaped gasket assembly 1800 of the present invention. This embodiment includes a U-shaped core 112 of any of the types and constructions described above. An electrically conductive cover 116 of any of the types and constructions described above is also employed. The cover 116 is attached to the core 112 by adhesive 122 applied to the cover 116. Flap 119 of the electrically conductive cover 116 is folded over onto the adhesive 122. In addition, adhesive 120 is applied to a portion of the attachment portion 114 of the core 112 and the flap 118 is folded over onto the adhesive 120, which is also used to affix the gasket assembly 1600 to an electrically conductive object. Adhesive 120 may also overlap the flap 119 to affix that flap to the electrically conductive object.

Figure 35:
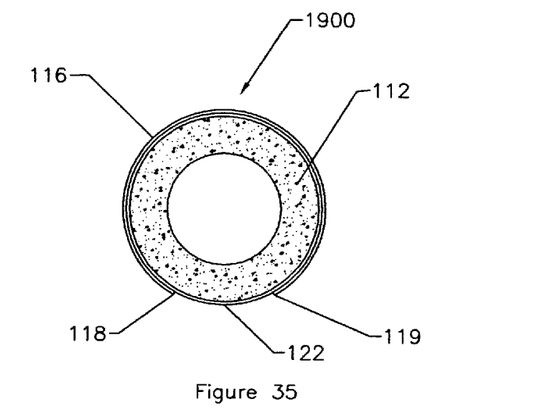
FIG. 35 is a cross-sectional view of another gasket assembly embodiment of the present invention.

FIG. 35 illustrates a circular-shaped gasket assembly 1900 of the present invention. This embodiment includes a hollow circular-shaped core 112 of any of the types and constructions described above. An electrically conductive cover 116 of any of the types and constructions described above is also employed. The cover 116 is attached to the core 112 by adhesive 122 applied to the outer surface of the core 112. The cover 116 does not cover the entire circumference of the core thereby leaving some of the adhesive 122 exposed to affix the gasket assembly 1900 to an electrically conductive object. For those applications wherein the adhesive can maintain the ends of the electrically conductive cover in contact with the electrically conductive object, the adhesive 122 does not have to have electrically conductive capability. In those applications wherein the electrically conductive object is shaped such that neither of the ends of the electrically conductive cover 116 is maintained in contact with the conductive object, electrically conductive adhesive may be employed.

The reader will appreciate that releasable liners 1150 of the type and construction described above could be effectively used in connection with any of the gasket assembly embodiments of the present invention without departing from the spirit and scope of the present invention.

The various embodiments of the present invention represent vast improvements over prior gaskets used in applications for controlling electromagnetic interference. For example, certain of the embodiments do not require the use of electrically conductive adhesive which can, overtime become ineffective in forming a path for facilitating the flow of electricity between a conductive object and the gasket. Various embodiment of the present invention can be made in a variety of different sizes and shapes utilizing conventional gasket manufacturing methods. Still other advantages of certain embodiments of the present invention involve the ability to be affixed to a conductive object utilizing mechanical fasteners such as clips and the like. After manufacture of the gasket embodiments described above, one or more of the gaskets may be applied around the periphery of an access door or other opening of an enclosure. The various gasket embodiments of the present invention could also be used in a variety of other shielding applications.

Those of ordinary skill in the art will, of course, appreciate that various changes in the details, materials and arrangement of parts which have been herein described and illustrated in order to explain the nature of the invention may be made by the skilled artisan within the principle and scope of the invention as expressed in the appended claims.

What is claimed is:

1. A gasket for attachment to an electrically conductive object, the gasket comprising:
   a core having a perimeter and an attachment portion; and
   an electrically conductive cover having a first and second end flap and being attached to the core by a first adhesive such that the electrically conductive cover extends at least partially around the perimeter of the core and the first and second end flaps are oriented adjacent the attachment portion; and
   a second adhesive on the attachment portion and affixing at least one of the first and second end flaps thereto such that a portion of the second adhesive remains exposed on the attachment portion to affix the gasket to the electrically conductive object such that at least one of the first and second end flaps are retained in contact with the electrically conductive object.

2. The gasket of claim 1 wherein the first adhesive is applied over at least a portion of the second adhesive.

3. The gasket of claim 1 wherein the first and second end flaps are each attached to the attachment portion by the first adhesive and the second adhesive.

4. The gasket of claim 1 wherein the first end flap is affixed to the attachment portion by the first adhesive and wherein the second end flap is affixed to the attachment portion by the first and second adhesives.

5. The gasket of claim 1 wherein the first end flap is affixed to the attachment portion of the core by the first adhesive and wherein the second end flap is affixed to the attachment portion of the core by the first and second adhesives and wherein a portion of the second adhesive covers a portion of the first end flap for adhering the first end flap to the electrically conductive object.

6. The gasket of claim 1 wherein the first adhesive covers the perimeter of the core.

7. The gasket of claim 1 wherein the core is hollow.

8. The gasket of claim 1 wherein the core is made from material selected from the group of materials consisting of closed cell foam, open cell foam, rubber, plastic and metal.

9. The gasket of claim 1 wherein the core is flexible.

10. The gasket of claim 1 wherein the core is fabricated from electrically conductive material.

11. The gasket of claim 1 wherein the first adhesive comprises a hot melt adhesive.

12. The gasket of claim 11 wherein the first adhesive is electrically conductive.

13. The gasket of claim 1 wherein the second adhesive comprises a pressure sensitive adhesive.

14. The gasket of claim 13 wherein the second adhesive is electrically conductive.

15. The gasket of claim 1 wherein the second adhesive comprises a hot melt adhesive.

16. The gasket of claim 15 wherein the second adhesive is electrically conductive.

17. The gasket of claim 1 wherein said electrically conductive cover is fabricated from a material selected from the group of materials consisting of plated fabric, plated woven fabric, plated non-woven fabric, plated knitted fabric, plated plastic, plated rubber, electrically conductive foil, electrically conductive woven wire and electrically conductive wire mesh.

18. The gasket of claim 1 wherein said core has a cross-sectional shape selected from the group of cross-sectional shapes consisting of: square-shapes, rectangular-shapes, circular-shapes, L-shapes, O-shapes, P-shapes, D-shapes and U-shapes.

19. The gasket of claim 1 further comprising a removable liner material on said second adhesive to protect said second adhesive prior to adhering said gasket to the electrically conductive object.

20. A gasket for attachment to an electrically conductive object, the gasket comprising:
   a core having a perimeter and an attachment portion; and
   an electrically conductive sheet-like cover having a first and second end flap and being attached to the core by a first adhesive such that the electrically conductive cover extends at least partially around the perimeter of the core and the first and second end flaps are oriented adjacent the attachment portion; and
   a second adhesive on the attachment portion between the end flaps for affixing the gasket to the electrically conductive object such that at least one of the first and second end flaps is retained in contact with the electrically conductive object.

21. The gasket of claim 20 wherein the core is hollow.

22. The gasket of claim 20 wherein the core is made from material selected from the group of materials consisting of closed cell foam, open cell foam, rubber, plastic and metal.

23. The gasket of claim 20 wherein the core is flexible.

24. The gasket of claim 20 wherein the core is fabricated from electrically conductive material.

25. The gasket of claim 20 wherein the first adhesive comprises a hot melt adhesive.

26. The gasket of claim 25 wherein the first adhesive is electrically conductive.

27. The gasket of claim 20 wherein the second adhesive comprises a pressure sensitive adhesive.

28. The gasket of claim 27 wherein the second adhesive is electrically conductive.

29. The gasket of claim 20 wherein the second adhesive comprises a hot melt adhesive.

30. The gasket of claim 20 wherein the second adhesive is electrically conductive.

31. The gasket of claim 20 wherein said electrically conductive sheet-like cover is fabricated from a material selected from the group of materials consisting of plated fabric, plated woven fabric, plated non-woven fabric, plated knitted fabric, plated plastic, plated rubber, electrically conductive foil, electrically conductive woven wire and electrically conductive wire mesh.

32. The gasket of claim 20 wherein said core has a cross-sectional shape selected from the group of cross-sectional shapes consisting of: square-shapes, rectangular-shapes, circular-shapes, L-shapes, O-shapes, P-shapes, D-shapes and U-shapes.

33. The gasket of claim 20 further comprising a removable liner material on said second adhesive to protect said second adhesive prior to adhering said gasket to the electrically conductive object.

34. A gasket for attachment to an electrically conductive object, the gasket comprising:
   a core having a perimeter and an attachment portion; and
   an electrically conductive cover having a first and second end flap and being attached to the core by a first adhesive only on the attachment portion of the core such that the electrically conductive cover extends at least partially around the perimeter of the core and the first and second end flaps are oriented adjacent the attachment portion; and
   a second adhesive on at least one of the first and second end flaps for affixing the gasket to the electrically conductive object such that at least one of the first and second end flaps is retained in contact with the electrically conductive object and wherein at least a portion of at least one of the first and second end flaps contacting the electrically conductive object does not have the second adhesive thereon.

35. A gasket for attachment to an electrically conductive object, the gasket comprising:
   a core having a perimeter and an attachment portion; and
   an electrically conductive cover having a first and second end flap and extending at least partially around the perimeter of the core;
   a first adhesive only on the attachment portion of the core and affixing the first end flap to the attachment portion; and
   a second adhesive on the attachment portion and affixing the second end flap thereto, a portion of the second adhesive being exposed between the first and second end flaps for affixing the gasket to the electrically conductive object such that at least one of the first and second end flaps is retained in contact with the electrically conductive object.

36. The gasket of claim 35 wherein a portion of the second adhesive covers at least a portion of the first end flap for affixing the first end flap to the electrically conductive object.

* * * * *